(12) United States Patent
Laven et al.

(10) Patent No.: US 10,679,857 B2
(45) Date of Patent: Jun. 9, 2020

(54) VERTICAL TRANSISTOR WITH TRENCH GATE INSULATOR HAVING VARYING THICKNESS

(71) Applicant: Infineon Technologies AG, Neubiberg (DE)

(72) Inventors: Johannes Georg Laven, Taufkirchen (DE); Anton Mauder, Kolbermoor (DE); Hans-Joachim Schulze, Taufkirchen (DE); Werner Schustereder, Villach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/441,534

(22) Filed: Jun. 14, 2019

(65) Prior Publication Data

US 2019/0295848 A1    Sep. 26, 2019

Related U.S. Application Data

(62) Division of application No. 15/687,874, filed on Aug. 28, 2017, now Pat. No. 10,366,895.

(30) Foreign Application Priority Data

Aug. 29, 2016 (DE) .......................... 10 2016 116 019

(51) Int. Cl.
*H01L 29/423* (2006.01)
*H01L 21/28* (2006.01)
(Continued)

(52) U.S. Cl.
CPC .. *H01L 21/28158* (2013.01); *H01L 21/28114* (2013.01); *H01L 21/31116* (2013.01);
(Continued)

(58) Field of Classification Search
None
See application file for complete search history.

(56) References Cited

U.S. PATENT DOCUMENTS 5,610,441 A      3/1997 Carl
5,783,491 A *    7/1998 Nakamura ........ H01L 21/76232
                                              257/E21.382
(Continued)

FOREIGN PATENT DOCUMENTS

DE      101 15 912      10/2002
DE      102 40 107      3/2004
(Continued)

OTHER PUBLICATIONS

"Investigation of Plasma Etching Mechanisms using Beams of Reactive Gas Ions", T.M. Mayer; et al., Journal of Vacuum Science and Technology, Mar. 1981.

*Primary Examiner* — Lex H Malsawma
(74) *Attorney, Agent, or Firm* — Dicke, Billig & Czaja, PLLC (57) ABSTRACT

A semiconductor device and method is disclosed. In one example, the method for forming a semiconductor device includes forming a trench extending from a front side surface of a semiconductor substrate into the semiconductor substrate. The method includes forming of material to be structured inside the trench. Material to be structured is irradiated with a tilted reactive ion beam at a non-orthogonal angle with respect to the front side surface such that an undesired portion of the material to be structured is removed due to the irradiation with the tilted reactive ion beam while an irradiation of another portion of the material to be structured is masked by an edge of the trench.

19 Claims, 7 Drawing Sheets

(51) Int. Cl.
  *H01L 29/40* (2006.01)
  *H01L 29/66* (2006.01)
  *H01L 29/739* (2006.01)
  *H01L 21/311* (2006.01)
  *H01L 21/3213* (2006.01)
  *H01L 29/78* (2006.01)
  *H01L 37/00* (2006.01)
  *H01L 29/04* (2006.01)
  *H01L 21/265* (2006.01)

(52) U.S. Cl.
  CPC ...... *H01L 21/32136* (2013.01); *H01L 29/407* (2013.01); *H01L 29/4236* (2013.01); *H01L 29/42368* (2013.01); *H01L 29/42376* (2013.01); *H01L 29/66348* (2013.01); *H01L 29/66734* (2013.01); *H01L 29/7397* (2013.01); *H01L 29/7813* (2013.01); *H01L 37/00* (2013.01); *H01J 2237/30472* (2013.01); *H01J 2237/3151* (2013.01); *H01L 21/2652* (2013.01); *H01L 29/045* (2013.01); *H01L 29/7395* (2013.01)

(56) References Cited

U.S. PATENT DOCUMENTS

| | | | |
|---|---|---|---|
| 7,056,802 | B2 | 6/2006 | Goldbach |
| 8,470,673 | B2 | 6/2013 | Dong |
| 9,166,027 | B2 | 10/2015 | Sandow et al. |
| 2002/0070379 | A1 | 6/2002 | Dennison |
| 2002/0121673 | A1* | 9/2002 | Jono ................. H01L 21/76232 257/510 |
| 2004/0063321 | A1 | 4/2004 | Goebel et al. |
| 2006/0166419 | A1 | 7/2006 | Shimoyama |
| 2007/0032020 | A1 | 2/2007 | Grebs et al. |
| 2010/0244125 | A1 | 9/2010 | Sonsky et al. |
| 2013/0168701 | A1* | 7/2013 | Kiyosawa ........... H01L 21/0475 257/77 |
| 2015/0340487 | A1 | 11/2015 | Siemieniec et al. |
| 2017/0103894 | A1 | 4/2017 | Aichinger et al. |

FOREIGN PATENT DOCUMENTS

| | | |
|---|---|---|
| DE | 103 33 777 | 3/2005 |
| DE | 10 2014 114 100 | 4/2015 |
| DE | 10 2014 107 325 | 11/2015 |
| DE | 10 2015 117 286 | 4/2017 |

\* cited by examiner

VERTICAL TRANSISTOR WITH TRENCH GATE INSULATOR HAVING VARYING THICKNESS

CROSS-REFERENCE TO RELATED APPLICATION

This Utility patent application is a divisional of U.S. patent application Ser. No. 15/687,874, filed Aug. 28, 2017, which claims priority to German Patent Application No. 10 2016 116 019.9, filed Aug. 29, 2016, both of which are incorporated herein by reference.

TECHNICAL FIELD

Embodiments relate to concepts for trench structures of semiconductor devices and in particular to methods for forming semiconductor devices and semiconductor devices.

BACKGROUND

A power semiconductor transistor, like an insulated-gate bipolar transistor (IGBT), may comprise a vertical metal-oxide-semiconductor (MOS)-structure with a vertical gate trench extending into a drift region of the power semiconductor transistor. Further, an oxide layer may be formed in the vertical gate trench.

Due to its geometrics a bottom of the vertical gate trench may be exposed to high electric field strengths during an operation of the power semiconductor transistor. Thereby, an undesired high feedback capacitance may be generated. Further, a premature aging of the oxide layer, in particular at the bottom of the vertical gate trench, may be promoted due to the exposure to high electric field strengths.

To reduce the electric field strength at the bottom of the vertical gate trench a thickness of the oxide layer at the bottom of the vertical gate trench may be increased. Such an oxide layer may be formed by an imprecise timed oxide etching process combined with a structured etch mask. Further, an increase of a thickness of the oxide layer in an upper portion of the vertical gate trench, e.g. in a channel region of the power semiconductor transistor, may result in an undesired increase of a threshold voltage of the power semiconductor transistor.

Alternatively, a shield electrode may be formed at the bottom of the vertical gate trench to reduce the electric field strength at the bottom of the vertical gate trench. Forming a gate trench with a shield electrode may comprise an imprecise times recess etch process of a material of the shield electrode.

SUMMARY

There may be a demand to provide a concept for semiconductor devices, which enables forming structures in a trench of a semiconductor device with an improved reproducibility and/or at low costs.

Such a demand may be satisfied by the subject matter of the claims.

Some embodiments relate to a method for forming a semiconductor device. The method comprises forming a trench extending from a front side surface of a semiconductor substrate into the semiconductor substrate. Further, the method comprises forming of material to be structured inside the trench. Additionally, the method comprises irradiating the material to be structured with a tilted reactive ion beam at a non-orthogonal angle with respect to the front side surface such that an undesired portion of the material to be structured is removed due to the irradiation with the tilted reactive ion beam while an irradiation of another portion of the material to be structured is masked by an edge of the trench.

Some embodiments relate to a semiconductor device comprising a gate trench of a vertical transistor structure. The gate trench extends from a front side surface of a semiconductor substrate into the semiconductor substrate. Further, at least one lateral part of an edge surface of the gate trench comprises at least one of a minimal angle between adjacent surface portions of the at least one lateral part of the edge surface larger than 100° and a minimal radius of curvature of the at least one lateral part of the edge surface larger than 100 nm. Additionally, the at least one lateral part of the edge surface extends from the front side surface of the semiconductor substrate to a side wall of the trench.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
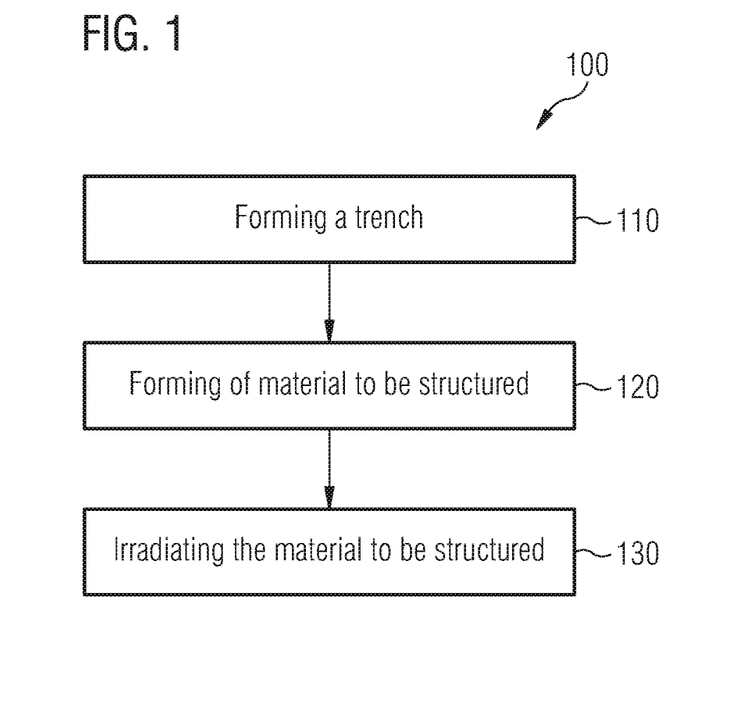
FIG. 1 shows a flow chart of a method for forming a semiconductor device.

FIG. 1 illustrates a flow chart of a method 100 for forming a semiconductor device according to an example. The method 100 comprises forming 110 a trench extending from a front side surface of a semiconductor substrate into the semiconductor substrate. Further, the method 100 comprises forming 120 of material to be structured inside the trench. Additionally, the method 100 comprises irradiating 130 the material to be structured with a tilted reactive ion beam at a (first) non-orthogonal angle with respect to the front side surface such that an undesired portion of the material to be structured is removed due to the irradiation 130 with the tilted reactive ion beam while an irradiation of another portion of the material to be structured is masked by an edge of the trench.

By the irradiation 130 of the material to be structured with a tilted reactive ion beam at the non-orthogonal angle to the front side surface, a lower portion of the trench may be shadowed by a first part of the edge, e.g. by an upper corner of the trench. Further, the undesired portion of the material to be structured may be removed from the edge of the trench down to a desired etching end point at a side wall of the trench. Hereby, the desired etching end point may be determined from the non-orthogonal angle and a width of the trench. In this way, the material may be structured with a high reproducibility and a high stability. Further, the material in the trench may be structured without requiring an additional mask so that the costs of forming the structured trench structure may be reduced.

The tilted reactive ion beam may be a directed ion beam or a highly conformal ion beam of ions able to remove irradiated portions of the material to be structured by sputtering and/or a chemical reaction with the material to be structured. Further, the tilted reactive ion beam may have a high selectivity (e.g. difference between etching rates) between the material to be structured and a semiconductor material of the semiconductor substrate. For example, the selectivity may be greater than 2:1 (e.g. a selectivity of 5:1, 10:1 or 15:1), greater than 20:1 (e.g. a selectivity of 25:1, 30:1 or 35:1), or greater than 40:1 (e.g. a selectivity of 45:1, 50:1 or 55:1). Further, the (first) non-orthogonal angle may be measured between a main beam direction (e.g. averaged over the direction of movement of the individual ions of the reactive ion beam) and a direction in parallel to the front side surface. For example, the non-orthogonal angle may be in the range of 5° to 75°, in the range of 15° to 75°, in the range of 25° to 65°, or in the range of 35° to 55°. For example, the (first) non-orthogonal angle may be less than 80° (or less than 70° or less than 60°). For example, during a movement of the ion beam over (e.g. from a first edge to an opposite edge) the semiconductor substrate during the irradiation 130 of the material to be structured with the tilted reactive ion beam at the (first) non-orthogonal angle, the (first) non-orthogonal angle may vary by less than 10% (or by less than 5%, or by less than 2%) of a target non-orthogonal angle desired for the irradiation 130 of the material to be structured. For example, an angle widening of the tilted reactive ion beam at the main surface of the semiconductor substrate may be less than +/−10°, +/−5°, +/−1°. The angle widening may be a difference between a maximal incidence angle and a minimal incidence angle of ions of the tilted reactive ion beam at the main surface of the semiconductor substrate. For example, the angle widening may vary form an average angle widening during scanning over the semiconductor substrate (e.g. from a first edge to an opposite edge) by less than 10% (or less than 5% or less than 2%) of the average angle widening. The angle widening may vary during scanning with the tilted reactive ion beam over the main surface of the semiconductor substrate due to a varying distance of the ion source to the main surface of the semiconductor substrate during the movement of the tilted reactive ion beam over the main surface of the semiconductor substrate.

For example, the forming 110 of the trench may comprise an etching of the trench into the semiconductor substrate (e.g. wet etching process or a dry etching process). The trench may have a (minimal or average) width at the front side surface of the semiconductor substrate of at least 100 nm (e.g. a width of at least 500 nm, at least 1 µm, at least 2 µm, at least 3 µm or at least 4 µm), at least 5 µm (e.g. a width of at least 6 µm, at least 7 µm, at least 8 µm or at least 9 µm), or at least 10 µm (e.g. a width of at least 15 µm, at least 20 µm or at least 25 µm) and/or a (maximal) depth of at least 300 nm (e.g. a depth of at least 500 nm, at least 1 µm, at least 2 µm, at least 3 µm or at least 4 µm), at least 5 µm (e.g. a depth of at least 6 µm, at least 7 µm, at least 8 µm or at least 9 µm), or at least 10 µm (e.g. a depth of at least 15 µm, at least 20 µm or at least 25 µm). The trench may be a gate trench of a vertical transistor structure, a field electrode trench, a trench with a gate electrode and a field electrode, a guard trench or an insulation trench. For example, the method may comprise depositing electrically conductive material inside the trench to form a gate electrode of a vertical transistor structure within the trench after the irradiation 130 of the material to be structured. In this way, a reliable gate trench for a vertical transistor structure may be formed with low effort.

Optionally, the material to be structured is an (first) insulating layer. The (first) insulating layer may comprise an oxide, like a silicon dioxide, or a nitride, like a silicon nitride. Further, the (first) insulating layer may have a thickness of at least 3 nm (e.g. a thickness of 5 nm, 10 nm or 20 nm), at least 25 nm (e.g. a thickness of 30 nm, 35 nm or 40 nm), at least 50 nm (e.g. a thickness of 60 nm, 70 nm, 80 nm or 90 nm), or at least 100 nm (e.g. a thickness of 150 nm, 200 nm, 300 nm, 400 nm or 500 nm). The forming 130 of the (first) insulating layer may comprise a thermal oxidation process (e.g. dry or wet thermal oxidation) or a chemical vapor deposition (CVD) process. The tilted reactive ion beam may comprise ions having a high etch rate for the material of the insulating layer and low etch rate for the semiconductor material of the semiconductor substrate.

For example, the method 100 may further comprise forming a second insulating layer inside the trench after the irradiation 130 of the first insulating layer to form a combined insulating layer with vertically varying thickness. In this way, an insulating layer with a step-like thickness increase in vertical direction may be formed. The second insulating layer may comprise an oxide, like a silicon dioxide, or a nitride, like a silicon nitride. Further, the second insulating layer may have a thickness of at least 3 nm (e.g. a thickness of 5 nm, 10 nm or 20 nm), at least 25 nm (e.g. a thickness of 30 nm, 35 nm or 40 nm), or at least 50 nm (e.g. a thickness of 60 nm, 70 nm, 80 nm, 90 nm or 100 nm). The forming 130 of the second insulating layer may comprise a thermal oxidation process or a chemical vapor deposition (CVD) process. Further, the vertical variation of the thickness of the combined insulating layer may be a variation of at least 10% (e.g. a variation of 15%, 20% or 25%), of at least 30% (e.g. a variation of 35%, 40% or 45%), or at least 50% (e.g. a variation of 60%, 70%, 80% or 90%) of a minimal thickness of the combined insulating layer. For example, a minimal thickness of the combined insulating layer may be less than 90% (or less than 70% or less than 50%) of a maximal thickness of the combined insulating layer (e.g. along a sidewall of the trench).

The combined insulating layer may be formed at a side wall of the trench. For example, a thickness of the combined insulating layer in an upper part of the side wall may be less than a thickness of the combined insulating layer in a lower part of the side wall. For example, the thickness in the lower part may be equal to or more than twice the thickness in the upper part (e.g. upper part located closer to front side surface than lower part). For example, the lower part of the side wall of the trench may be located in a drift region of a vertical transistor structure while the upper part of the side wall of the trench may be located in a channel region of the vertical transistor structure. For example, the combined insulating layer may comprise a graded thickness transition zone between the upper part of the side wall and the lower part of the side wall of the trench.

For example, semiconductor material from a side wall of the trench may be converted (e.g. by oxidation) to form at least a part of the second insulating layer during the forming of the second layer Further, the method 100 may comprise, after the forming of the second insulating layer, removing the combined insulating layer from the trench to form a trench with a vertically varying width. In this way, a trench with a well-defined taper may be formed. The removing of the combined insulating layer may comprise a dry etching process or a wet etching process. Further, the width of the trench may vary vertically by at least 10% (e.g. by 15%, 20% or 25%), by at least 30% (e.g. by 35%, 40% or 45%), or by at least 50% (e.g. by 60%, 70%, 80% or 90%) of a width of the trench at the front side surface. For example, a width of the trench at 80% of a maximal depth of the trench may be less than 90% (or less than 80% or less than 70%) of a width of the trench at 10% of a maximal depth of the trench.

Optionally, the method 100 may further comprise, after removing the undesired portion of the material to be structured, introducing or incorporating dopants into the semiconductor substrate at least at portions of the side wall of the trench at which at least a portion of the material to be structured was removed during irradiation with the tilted reactive ion beam to form a doping region with a doping concentration varying vertically along the trench. Alternatively, the method 100 may further comprise, after forming of an optional second insulating layer, incorporating dopants into the semiconductor substrate through the combined insulating layer to form a doping region with a doping concentration varying vertically along the trench. In this way, a doping profile with a well-defined vertical variation of a doping level may be implemented. Thereby, an effective junction termination for a vertical transistor structure may be formed. The doping concentration may vary vertically by at least 10% of a maximal doping concentration of a region located adjacent to the trench. For example, the doping concentration may vary vertically by at least 10% (e.g. by 15%, 20% or 25%), by at least 30% (e.g. by 35%, 40% or 45%), or by at least 50% (e.g. by 60%, 70%, 80% or 90%) of a maximal doping concentration of a region located adjacent to the trench. The method 100 may further comprise, after the incorporating of the dopants into the semiconductor substrate, removing the material to be structured or the combined insulating layer from the trench, for example.

Alternatively, the material to be structured may be an electrically conductive material. The electrically conductive material may be aluminum, copper, tungsten and/or poly silicon and/or an alloy of aluminum, copper, tungsten and/or poly silicon. The forming of the electrically conductive material inside the trench may comprise a chemical vapor deposition (CVD) process. For example, the electrically conductive material may form a gate electrode of a vertical transistor structure, a control electrode of a vertical transistor structure, a shielding electrode of a vertical transistor structure or a field electrode within the trench. The electrically conductive material may have a slanted top or a triangular top after the irradiating 130 of the electrically conductive material due to the tilted irradiation. Further, an insulating layer may be formed inside the trench before the forming of the electrically conductive material inside the trench. The tilted reactive ion beam may comprise ions having a high etch rate for the electrically conductive material and low etch rate for the semiconductor material of the semiconductor substrate and/or the material of the optional insulating layer formed before the electrically conductive material.

For example, the method 100 may further comprise forming an insulating layer on a surface of the electrically conductive material after the irradiation 130 of the electrically conductive material. In this way, a capping layer atop of the electrically conductive material (e.g. implementing a field or shielding electrode) can be formed. Further, electrically conductive material may be formed on the insulating layer, e.g. to form a gate electrode of a vertical transistor structure.

For example, the tilted reactive ion beam may be a ribbon beam. In this way, a reproducibility of the formed semiconductor device may be enhanced and/or a manufacturing speed may be increased in comparison to a spot beam. Alternatively, the tilted reactive ion beam may be a spot beam.

For example, the ribbon beam has a length at the front side surface of the semiconductor substrate larger than a lateral dimension of the semiconductor substrate (e.g. semiconductor wafer). In this way, a plurality of semiconductor devices can be formed on the semiconductor substrate, e.g. a semiconductor wafer, with a high reproducibility over a semiconductor substrate diameter.

For example, the edge of the trench may be beveled, chamfered or rounded due to the irradiation 130 of the material to be structured with the tilted reactive ion beam. In this way, an electric field crowding at the edge of the trench may be avoided. The edge of the trench may be beveled with an angle of at least 100°. Alternatively, the edge of the trench may be chamfered with an angle of at least 100°. Alternatively, the edge of the trench may be rounded with a radius of curvature of at least 100 nm. Further, a shape of a part of the edge of the trench may be a rounded shape, a circular shape, an oval shape, a parabolic shape, a bevel, a chamfer or an angular shape.

For example, the method 100 further comprises, after the irradiation 130 of the material to be structured, irradiating a material to be structured (e.g. same material as during irradiation under the first angle or another material, for example a second insulation layer, formed after irradiation under the first angle) with the tilted reactive ion beam at a second non-orthogonal angle (different from the first non-orthogonal angle) with respect to the front side surface such that an undesired portion of the (same or other) material to be structured is etched due to the irradiating with the tilted reactive ion beam while an irradiation of another portion of the material to be structured is (again) masked by the edge of the trench. In this way, the material to be structured can be structured with a higher degree of freedom. The material to be structured may be the material formed during irradiation under the first non-orthogonal angle. Alternatively, the material to be structured may be formed inside the trench in an additional step. The irradiation of the another portion of the material to be structured may be masked by the first part of the edge of the trench. Alternatively, the irradiation of the another portion of the material to be structured may be masked by a second part of the edge of the trench. For example, the first part of the edge and the second part of the edge are edges of the trench located at opposite sides of the trench. Further, the second non-orthogonal angle may be in the range of 5° to 75°, in the range of 15° to 75°, in the range of 25° to 65°, or in the range of 35° to 55°. In this way, a step-like variation of the oxide thickness with many steps can be achieved so that a nearly gradual thickness variation can be achieved.

The semiconductor substrate may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or a gallium arsenide (GaAs)-based semiconductor substrate, or a gallium nitride (GaN)-based semiconductor substrate. Further, the semiconductor substrate may be a semiconductor wafer or a semiconductor die.

For example, a vertical direction or a vertical dimension may be measured orthogonal to a front side surface of the semiconductor substrate and a lateral direction or lateral dimensions may be measured in parallel to the front side surface of the semiconductor substrate.

The front side or front side surface of the semiconductor substrate may be the side used to implement more sophisticated and complex structures than at the backside of the semiconductor substrate, since the process parameters (e.g. temperature) and the handling may be limited for the backside, if structures are already formed at one side of the semiconductor substrate, for example.

For example, the method 100 comprise additional processes for forming electrical element structures (e.g. forming doping regions and/or wiring structures) before and/or after irradiating the trench with the tilted reactive ion beam.

For example, the semiconductor device may be a power semiconductor device. A power semiconductor device and/or an electrical element structure (e.g. a transistor structure or a diode structure) of the power semiconductor device may have a breakdown voltage or blocking voltage of more than 10V (e.g. a breakdown voltage of 10V, 20V or 50V), more than 100V (e.g. a breakdown voltage of 200 V, 300V, 400V or 500V), more than 500V (e.g. a breakdown voltage of 600V, 700V, 800V or 1000V) or more than 1000V (e.g. a breakdown voltage of 1200V, 1500V, 1700V, 2000V, 3300V or 6500V). The semiconductor device may comprise a vertical transistor structure with a gate trench as described above or below. The vertical transistor structure may be may be a vertical MOSFET (Metal-Oxide-Semiconductor-FET) or a vertical insulated-gate bipolar transistor (IGBT) comprising a plurality of transistor cells. Each transistor cell may comprise a gate trench or shares a gate trench with one or more other transistor cells.

Figure 2A:
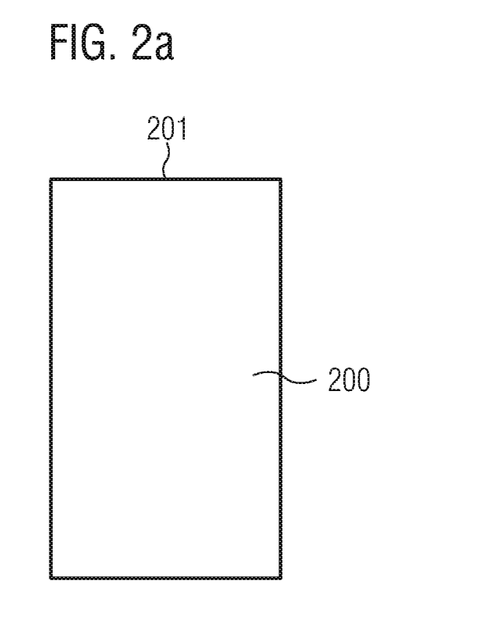
FIGS. 2a to 2f illustrate a process for forming a semiconductor device.
Figure 2B:
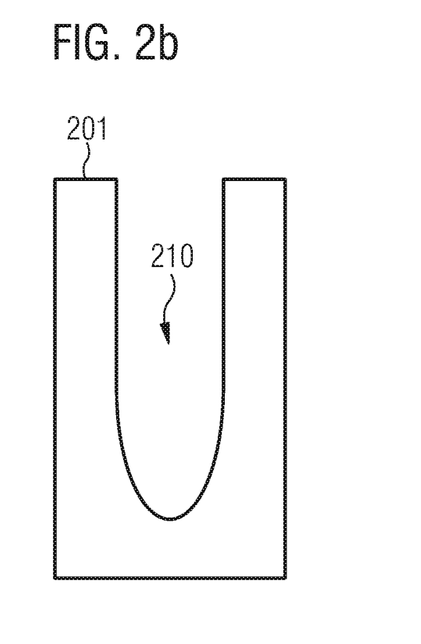

FIGS. 2a to 2f illustrate a process for forming a semiconductor device according to an example. The method for forming the semiconductor device may be similar to the method described in connection with FIG. 1. FIG. 2a shows a semiconductor substrate 200 with a front side surface 201. At least one trench 210 extending from the front side surface 201 of the semiconductor substrate 200 into the semiconductor substrate 200 is formed as shown in FIG. 2b. For example, the trench 210 may be etched into the semiconductor surface 200 using conventional process technologies.

Figure 2C:
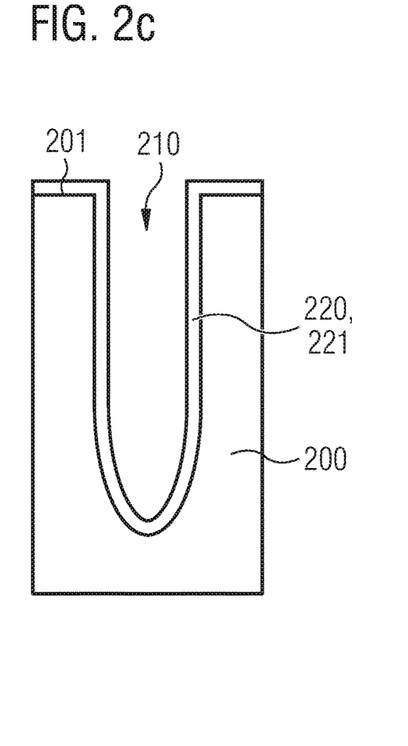

Material 220 to be structured is formed inside the trench 210. In this example, the material 220 to be structured is a first insulating layer 221. For example, the first insulating layer 221 may comprise a first oxide layer grown using conventional process technologies. Further, a portion of the first insulating layer 221 may cover the front side surface 201. FIG. 2c shows the semiconductor substrate 200 after the forming 120 of the material 220 to be structured inside the trench 210.

Figure 2D:
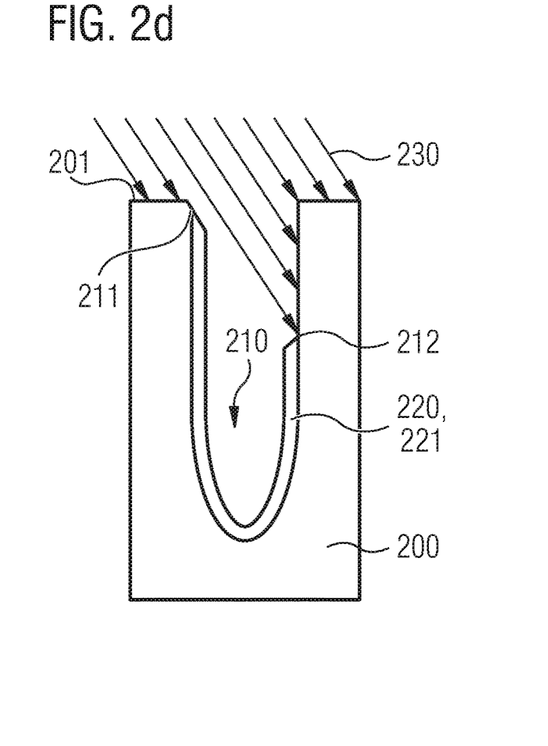

FIG. 2d shows an irradiating 130 of the insulating layer 221 to be structured with the tilted reactive ion beam 230 at a non-orthogonal angle to the front side surface 210 from the left.

The reactive ion beam 230 is masked by the left part of the edge 211 of the trench 210 such that only a portion of the insulating layer 221 higher than an etching point 212 at the right side wall of the trench 210 is etched. For example, the insulating layer 221 or oxide layer may be removed only to a desired depth by the tilted reactive ion beam 230. The depth to which the insulating layer 221 is removed may be controlled by the width of the trench 210 and the non-orthogonal angle of the tilted reactive ion beam 230. Additionally, the irradiation 130 may be repeated in different directions or may be applied only in one orientation. Further, the portion of the insulating layer 221 covering the front side surface 201 may be etched due to the irradiating 130 of the insulating layer 221 to be structured with the tilted reactive ion beam 230.

For example, a graded thickness of the remaining first insulating layer 221, e.g. of a remaining oxide, during the etching may be achieved. The etching, e.g. a directed reactive etching, may be influenced by a thickness of a material on the left corner of the trench 210, where, at least in a first etching step, no further etching occurs. This effect may be increased by scanning the semiconductor substrate 200, e.g. a wafer, with an etching beam, which has only little overetch on the surfaces where sidewall layers may be removed.

Figure 2E:
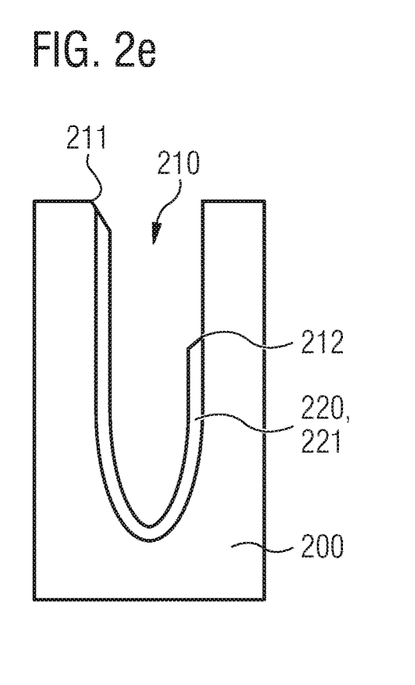

FIG. 2e shows the semiconductor substrate 200 with the trench 210 after the irradiating 130 of the insulating layer 221 to be structured with the tilted reactive ion beam 230. At the right side wall of the trench 210 the first insulating layer 221 is completely etched from the top corner of the trench 210 to the etching end point 212. Further, the first insulating layer 221 is beveled at the left part of the edge 211 and at the etching end point 212.

A second insulating layer is formed inside the trench 210 after the irradiating 130 of the first insulating layer 221 to form the combined insulating layer 240 with vertically varying thickness. For example, a second oxide layer, which amounts to the oxide layer in the depth where the first oxide layer has been removed in the previous step, may be grown. In greater depths of the trench 210 a total oxide thickness may be given by the thickness of the combined processing steps.

Figure 2F:
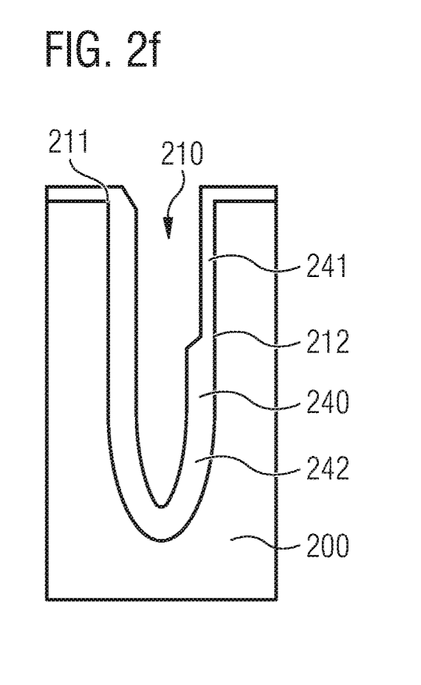

FIG. 2f shows the semiconductor substrate 200 after forming the combined insulating layer 240. On the right side wall of the trench 210 the combined insulating layer 240 has an upper portion 241 and a lower portion 242 separated by the etching end point 212. A thickness of the upper portion 241 is less than a thickness of the lower portion 242. For example, the combined insulating layer 240 may form a thick trench bottom oxide. On the left side wall of the trench 210, the combined insulating layer 240 has a constant thickness. Further, the combined insulating layer 240 is beveled at the left part of the edge 211 and at the etching end point 212.

For example, the tilted reactive ion beam 230 may be a directed reactive beam with good angle control. In this way, superior structures with unprecedented reproducibility and stability over a dimension of the semiconductor substrate 200, e.g. over a wafer diameter, may be formed.

For example, the formed semiconductor device may comprise a structure with a thick trench bottom oxide. For example, a cross-section of a gradient of the combined insulating layer 240 may show a thickness variation between different thickness plateaus, e.g. between oxide thickness plateaus.

More details and aspects are mentioned in connection with the embodiments described above or below. The embodiment shown in FIGS. 2a to 2f may comprise one or more optional additional features corresponding to one or more aspects mentioned in connection with the proposed concept or one or more embodiments described above (e.g. FIG. 1) or below (e.g. FIG. 3a-7).

Figure 3A:
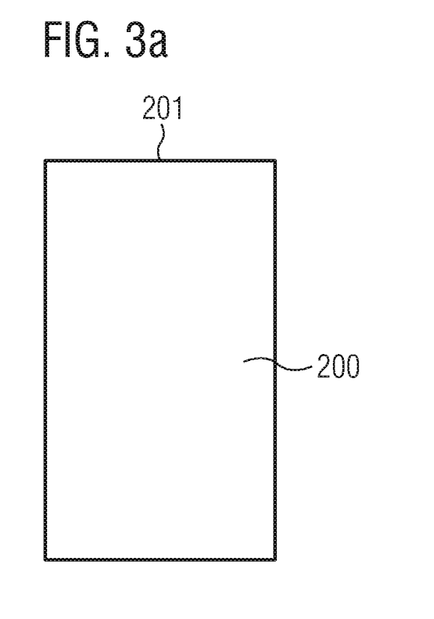
FIGS. 3a to 3f illustrate a process for forming a semiconductor device.
Figure 3B:
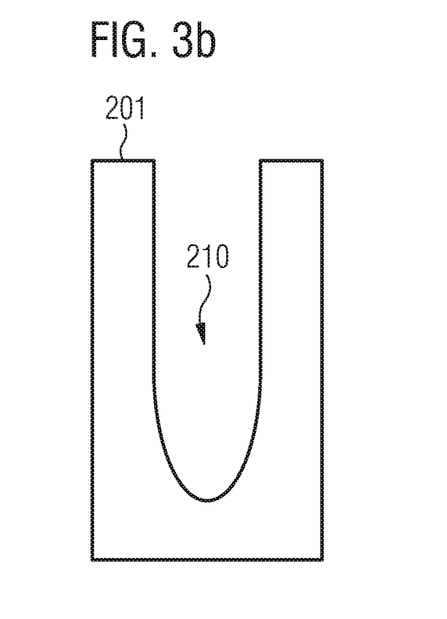
Figure 3C:
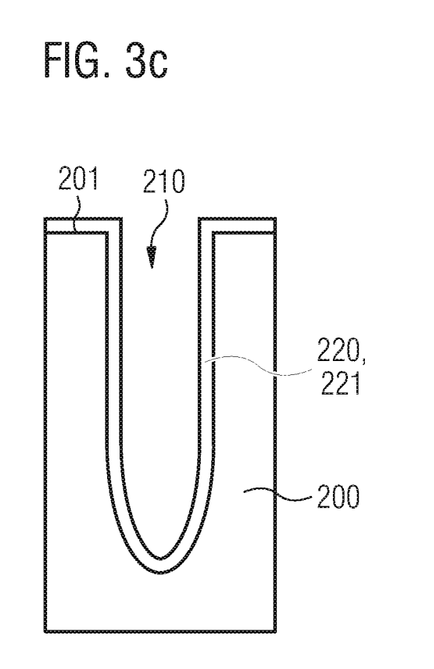
Figure 3D:
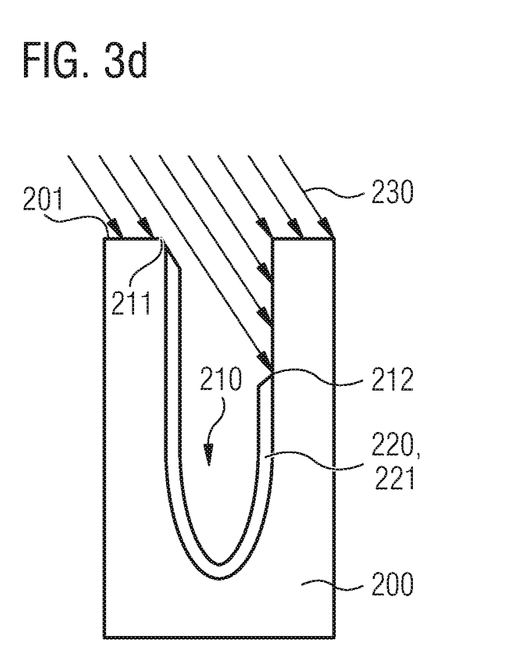
Figure 3E:
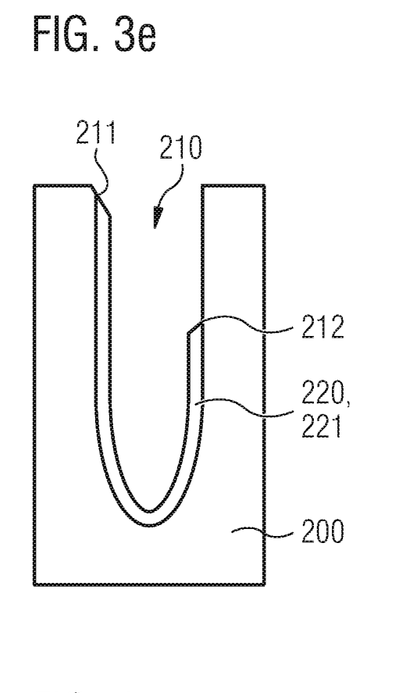
Figure 3F:
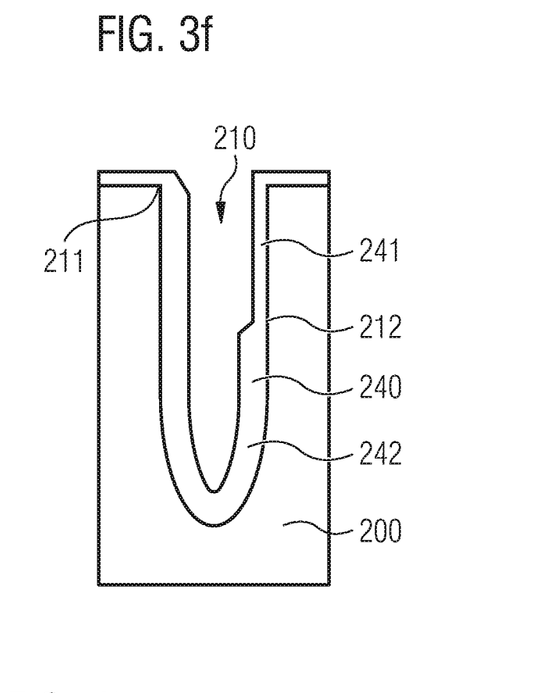

FIGS. 3a to 3f illustrate a process for forming a semiconductor device according to a further example. The method for forming the semiconductor device may correspond to the method described in connection with FIGS. 2a to 2f. In difference to the method described in connection with FIGS. 2a to 2f a tilted reactive ion beam 230 with a lower selectivity in etching rates between a material of the semiconductor substrate 200, e.g. silicon, and a material of the insulating layer 221, e.g. silicon dioxide, is used. Thereby, the left part of the edge 211 is beveled due to the irradiation 130 of the insulating layer 221 to be structured with the tilted reactive ion beam 230. The beveled left part of the edge 211 is shown in FIGS. 3d to 3f.

For example, the selectivity in etching rates, e.g. between silicon and silicon dioxide, for the tilted reactive ion beam 230 or an ion beam processes may be limited. In other words, as an example: when removing the insulating layer 221, e.g. a silicon dioxide layer, by the irradiating 130 on the right side wall of the trench 210 some overetch may be desirable during which also the left part of the edge 211 or a shadowing corner of the masking silicon of the trench 210 may be etched by the tilted reactive ion beam 230. This etching may lead to a beveling of the, e.g. silicon, edge 211 of the trench 210, which may be favorable since the sharp corner is rounded. Thereby, an electric field crowding at the edge 211 may be avoided. For example, also the right part of the edge 211 may be etched by the tilted reactive ion beam 230. Thereby, the right part of the edge 211 may be beveled or rounded. When irradiating the insulating layer 221 from both sides of the trench 210, both corners of the trench 210 may be etched differently by the tilted reactive ion beam 230 and thus may show at least slightly different geometry.

For example, by means of repeating the forming 120 of the insulating layer 221 and the irradiating 130 of the insulating layer 221 several times using different non-orthogonal angles or beam angles, a combined insulating layer 240 or a trench oxide with a quasi-continuous vertical variation of the oxide thickness may be implemented in a well-defined manner. This may enable e.g. an implementation of a combined insulating layer 240, gate oxides or field plate oxides with a high degree of freedom for the variation of their vertical thickness. Such field plates with oxide thicknesses varying in vertical direction may be also used for junction terminations using one or several vertical field plates whereby the graded oxide thickness transition between the different plateaus may be helpful for a reduction of the electrical field. For example, if the semiconductor device is a silicon carbide (SiC)-based device, such graded oxides may be used due to the high electrical field strengths occurring within these devices.

For example, removing the combined insulating layer 240 or graded oxides may enable an implementation of trenches with a well-defined taper for the case that the combined insulating layer 240 has been or the graded oxides have been created by dry or wet thermal oxidation. This may be used e.g. for the implementation of inversion channels in planes with enhanced mobility like for e.g. for the case of SiC power metal-oxide-semiconductor field-effect transistors (MOSFET). Examples are a so-called A-plane or a $\{0\overline{3}3\overline{8}\}$ face of a 4H—SiC crystal.

More details and aspects are mentioned in connection with the embodiments described above or below. The embodiment shown in FIGS. 3a to 3f may comprise one or more optional additional features corresponding to one or more aspects mentioned in connection with the proposed concept or one or more embodiments described above (e.g. FIG. 1-20 or below (e.g. FIG. 4a-7).

Figure 4A:
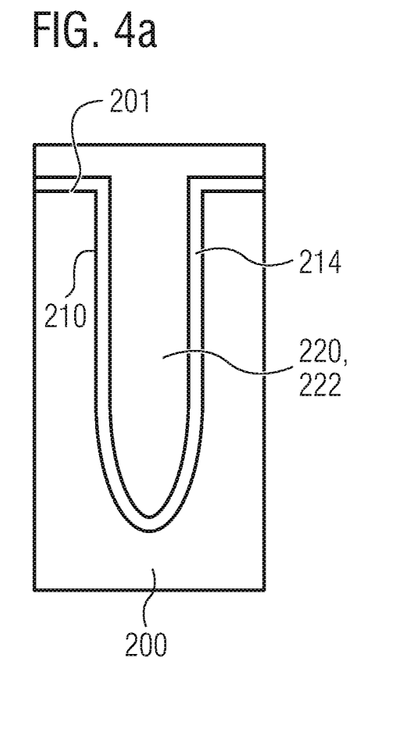
FIGS. 4a to 4d illustrate a process for forming a semiconductor device.

FIGS. 4a to 4d illustrate a process for forming a semiconductor device according to a further example. The method for forming the semiconductor device may be similar to the method described in connection with FIG. 1. A trench 210 extending from a front side surface 201 of a semiconductor substrate 200 into the semiconductor substrate 200 is formed. For example, the forming 110 may comprise an etching of the trench 210 using conventional process technologies. A third insulating layer 214, e.g. an oxide layer, is grown inside the trench 210. A portion of the third insulating layer 214 may cover the front side surface 201. For example, the third insulating layer 214 may be grown using conventional process technologies. The third insulating layer 214 may be or may form an element of the trench 210. Material 220 to be structured is formed inside the trench. In this example, the material 220 to be structured is an electrically conductive material 222, like poly silicon. Further, a portion of the electrically conductive material 222 may cover the front side surface 201. FIG. 4a shows the semiconductor device after the forming 120 of the electrically conductive material 222 inside the trench 210.

Figure 4B:
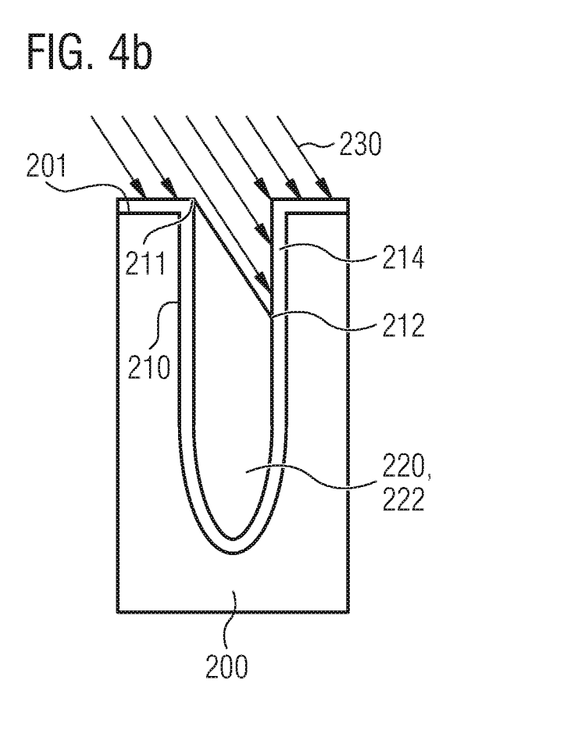

FIG. 4b shows an irradiating 130 of the electrically conductive material 222 to be structured with the tilted reactive ion beam 230 at a first non-orthogonal angle to the front side surface 210 from the left. The reactive ion beam 230 is masked by the left part of the edge 211 of the trench 210 such that only a portion of the electrically conductive material 222 higher than the etching end point 212 at the right side wall of the trench 210 is etched. For example, the electrically conductive material 222 may be removed only to a desired depth by the tilted reactive ion beam 230. The depth to which the electrically conductive material 222 is removed may be controlled by the width of the trench 210 and the non-orthogonal angle of the tilted reactive ion beam 230.

For example, the electrically conductive material 222 may form a shield electrode arranged below a control or gate electrode inside the trench 210. Further, the electrically conductive material 222 may be an electrode material for a shield electrode or a shielding electrode. For example, if the irradiating 130 of the electrically conductive material 222 to be structured is run only in a single direction, a slanted top control or gate electrode may be formed by the electrically conductive material 222.

Figure 4C:
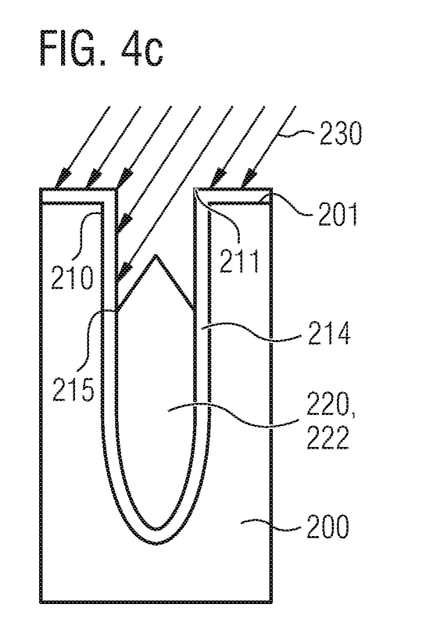

The irradiation 130 of the electrically conductive material 222 to be structured may be optionally repeated in different directions as shown in FIG. 4c. The irradiation 130 of the electrically conductive material 222 to be structured with the tilted reactive ion beam 230 is repeated at a second non-orthogonal angle to the front side surface 210 from the right. The reactive ion beam 230 is masked by the right part of the edge 211 of the trench 210 such that only a portion of the electrically conductive material 222 higher than a further etching end point 215 at the left side wall of the trench 210 is etched.

Figure 4D:
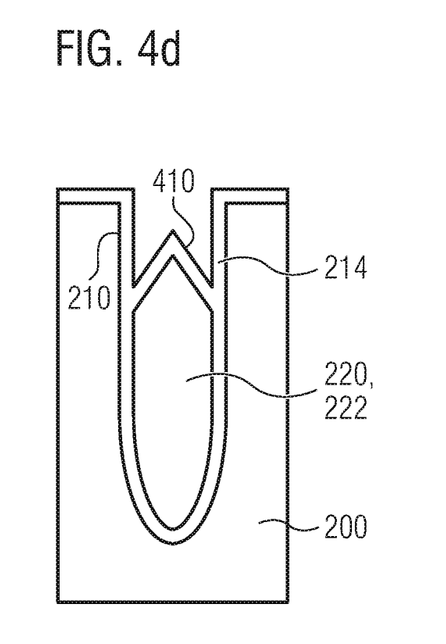

A fourth insulating layer 410, e.g. an oxide layer, is grown on the electrically conductive material 222, which forms a capping layer atop of the electrically conductive material 222. For example, the electrically conductive material 222 may form a shielding electrode. FIG. 4d shows the semiconductor substrate 200 after the growing of the fourth insulating layer 410. Further, a desired electrode material for a control electrode may be disposed, e.g. on top of the fourth insulating layer 410.

For example, the formed semiconductor device may form a structure with a shield electrode below a control electrode or a gate electrode.

More details and aspects are mentioned in connection with the embodiments described above or below. The embodiment shown in FIGS. 4a to 4d may comprise one or more optional additional features corresponding to one or more aspects mentioned in connection with the proposed concept or one or more embodiments described above (e.g. FIG. 1-3f) or below (e.g. FIG. 5-7).

Figure 5:
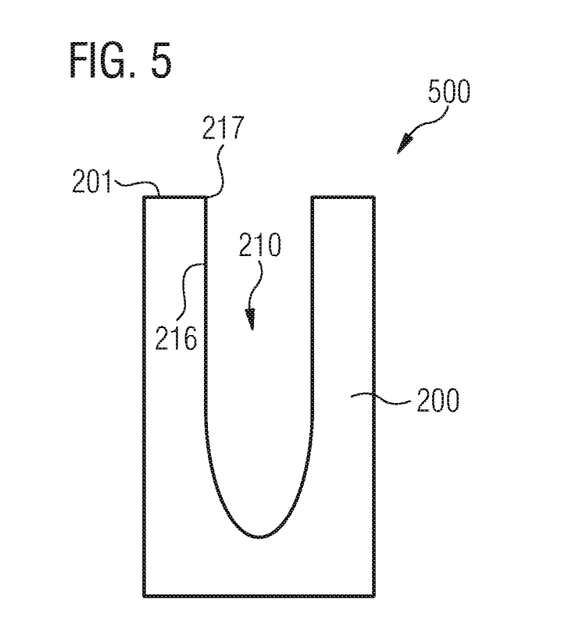
FIG. 5 shows a schematic illustration of a semiconductor device.

FIG. 5 is a schematic illustration of a semiconductor device 500 according to an example. The semiconductor device 500 comprises a gate trench 210 of a vertical transistor structure. The gate trench 210 extends from a front side surface 201 of a semiconductor substrate 200 into the semiconductor substrate 200. Further, at least one lateral part 217 of an edge surface of the gate trench 210 comprises at least one of a minimal angle between adjacent surface portions of the at least one lateral part 217 of the edge surface larger than 100° and a minimal radius of curvature of the at least one lateral part 217 of the edge surface larger than 100 nm. Additionally, the at least one lateral part 217 of the edge surface extends from the front side surface 201 of the semiconductor substrate 200 to a side wall 216 of the trench 210.

In this way, a crowding of an electrical field at the at least one lateral part 217 during an operation of the semiconductor device 500 may be avoided. By that, an aging of the semiconductor device 500 may be slowed.

Figure 6A:
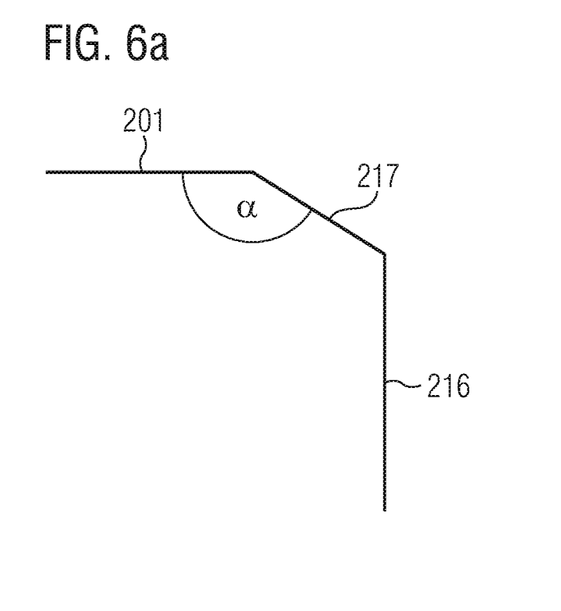
FIGS. 6a and 6b show schematic illustrations of lateral parts of an edge surface.

FIGS. 6a and 6b show schematic illustrations of the lateral part 217 of the edge surface. In the example shown in FIG. 6a, the lateral part 217 extends from the front side surface 201 to the side wall 216 and is inclined with respect to the front side surface 201 by an angle α larger than 100°. For example, the angle α may be may be in the range of 105° to 175°, in the range of 115° to 165°, in the range of 125° to 155°, or in the range of 135° to 145°.

For example, any angle between adjacent surface portions of the at least one lateral part 217 may be larger than 100°. For example, any angle between adjacent surface portions of the at least one lateral part 217 may be in the range of 105° to 175°, in the range of 115° to 165°, in the range of 125° to 155°, or in the range of 135° to 145°.

Figure 6B:
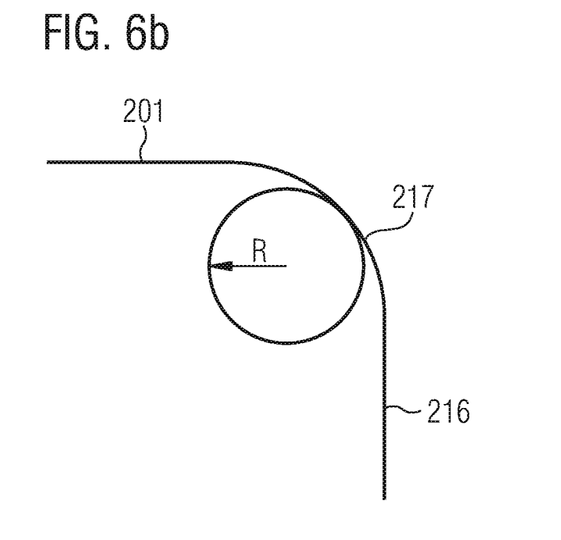

In the example shown in FIG. 6b, the lateral part 217 extends from the front side surface 201 to the side wall 216 and has a minimal radius R of curvature larger than 100 nm. For example, the radius R may be larger than 100 nm (e.g. a radius of 110 nm, 120 nm, 130 nm, 140 nm, 150 nm or 175 nm), larger than 200 nm (e.g. a radius of 225 nm, 250 nm, 275 nm, 300 nm or 350 nm), or larger than 400 nm (e.g. a radius of 450 nm, 500 nm or 600 nm).

For example, any radius of curvature of the at least one lateral part 217 may be larger than 100 nm. For example, any radius of curvature of the at least one lateral part 217 may be larger than 100 nm (e.g. a radius of 110 nm, 120 nm, 130 nm, 140 nm, 150 nm or 175 nm), larger than 200 nm (e.g. a radius of 225 nm, 250 nm, 275 nm, 300 nm or 350 nm), or larger than 400 nm (e.g. a radius of 450 nm, 500 nm or 600 nm).

The semiconductor device 500 may be formed using the method 100 described above. Further optional additional features of the semiconductor device 500 follow directly from the features of the method 100.

For example, the at least one lateral part 217 of the edge surface may comprise a tilted surface portion. An extension of the tilted surface portion may be larger than 50 nm and an angle between the tilted surface portion and the front side surface may be between 20° and 80°.

For example, a first lateral part of the edge surface may have a first shape and a second lateral part of the edge surface has a second shape. The first shape and the second shape may be unsymmetrical. In this way, an electrical field distribution at the first part can be different from an electrical field distribution at the second part during an operation of the semiconductor device 500. For example, the first shape and/or the second shape may be a rounded shape, a circular shape, an oval shape, a parabolic shape, a bevel, a chamfer or an angular shape.

For example, the first shape may be a circular shape with a first radius and the second shape may be a circular shape with a second radius, the first radius being greater than the second radius. Alternatively, the first shape may be a bevel with a first bevel angle and the second shape may be a bevel with a second bevel angle, the first bevel angle being greater than the second bevel angle.

For example, a side wall of the gate trench 210 may be covered by an insulating layer 240 with vertically varying thickness. In this way, a gate electrode of the vertical transistor structure formed inside the trench can be electrically isolated from the semiconductor substrate 200. The vertical variation of the thickness of the insulating layer 240 may be a variation of at least 10% (e.g. a variation of 15%, 20% or 25%), of at least 30% (e.g. a variation of 35%, 40% or 45%), or at least 50% (e.g. a variation of 60%, 70%, 80% or 90%) of a minimal thickness of the insulating layer 240. For example, a minimal thickness of the insulating layer 240 may be less than 90% (or less than 70% or less than 50%) of a maximal thickness of the insulating layer 240 (e.g. along a sidewall of the trench).

For example, the insulating layer 240 may be formed at a side wall of the trench 210. A thickness of the insulating layer 240 in an upper part of the side wall may be less than a thickness of the insulating layer 240 in a lower part of the side wall. For example, the thickness in the lower part may be twice the thickness in the upper part (e.g. upper part located closer to front side surface 201 than lower part). The lower part of the side wall may be located at a drift region of the vertical transistor structure. Further, the upper part of the side wall may be located at a channel region of the vertical transistor structure.

For example, the insulating layer 240 may be graded. In this way, the gate trench 210 may be used as a diffusion mask to implement a doping profile with a well-defined vertical variation of a doping level.

For example, a width of the gate trench 210 at 80% of a maximal depth of the gate trench 210 may be less than 90% of a width of the gate trench 210 at 10% of a maximal depth of the gate trench 210. In this way, inversion channels in planes with enhanced mobility may be implemented, e.g. for silicon carbide (SiC) power metal-oxide-semiconductor field-effect transistors (MOSFET)

For example, the semiconductor substrate 200 may be a wide band gap semiconductor substrate. The semiconductor substrate 200 may be a SiC substrate. Alternatively, the semiconductor substrate 200 may be a gallium arsenide (GaAs)-based semiconductor substrate or a gallium nitride (GaN)-based semiconductor substrate. Further, the semiconductor substrate 200 may be a semiconductor wafer or a semiconductor die.

For example, the vertical transistor structure may comprise a breakdown voltage of more than 10V. For example, the semiconductor device 500 may be a power semiconductor device, e.g. an insulated-gate bipolar transistor (IGBT). A power semiconductor device or an electrical structure (e.g. transistor structure or diode structure) of the power semiconductor device may have a breakdown voltage or blocking voltage of more than 10V (e.g. a breakdown voltage of 10V, 20V or 50V), more than 100V (e.g. a breakdown voltage of 200V, 300V, 400V or 500V), more than 500V (e.g. a breakdown voltage of 600V, 700V, 800V or 1000V) or more than 1000V (e.g. a breakdown voltage of 1200V, 1500V, 1700V, 2000V, 3300V or 6500V).

For example, the semiconductor device 500 may comprise a shield electrode or a gate electrode of a vertical transistor structure arranged within the trench 210. The shield electrode or the gate electrode may have a slanted top or a triangular top.

For example, the semiconductor device 500 may be an IGBT with a trench gate or a vertical trench MOSFET with a stack of a gate electrode and a field plate on source potential for charge compensation purposes.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIG. 1-4d) or below (e.g. FIG. 7).

Figure 7:
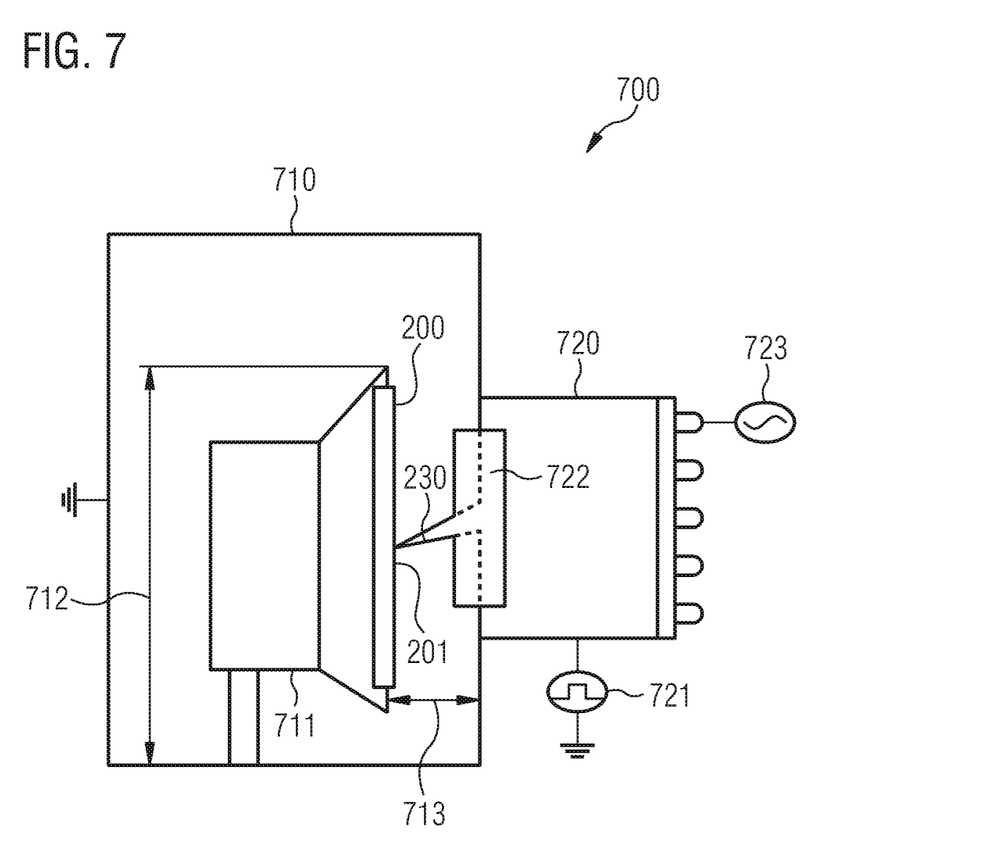
FIG. 7 shows a schematic illustration of a reactive ion beam etching system.

FIG. 7 shows a schematic illustration of a reactive ion beam etching system 700. The reactive ion beam etching system 700 comprises an end station 710 and a plasma chamber 720. The end station 710 comprises a table 711 to which the semiconductor substrate 200 is attached to. The table 711 can be moved in wafer scanning directions indicated by the arrow 712. Further, the semiconductor substrate 200 is located at a distance 713 from the plasma chamber 720. The plasma chamber 720 comprises a pulsed direct current (DC) supply 721, tunable optics 722 and a radio frequency (RF) source supply 723.

In the plasma chamber 710 plasma may be generated by applying a radio frequency electromagnetic field generated by the RF source supply 723 to a gas in the plasma chamber 710. Due to an oscillation of the radio frequency electromagnetic field molecules of the gas may be ionized by stripping them of electrons. Additionally, the tunable optics 722 may generate the tilted reactive ion beam 230 from the ionized molecules of the gas. The tunable optics 722 may further emit the tilted reactive ion beam 230 at a non-orthogonal angle such that the tilted reactive ion beam 230 is irradiated at the non-orthogonal angle to the front side 201 of the semiconductor device 200, if the front side surface 201 is arranged in parallel to the tunable optics 722. Alternatively, the table 711 may be inclined with respect to the tunable optics 722 such that the tilted reactive ion beam 230 is irradiated at the non-orthogonal angle to the front side 201 of the semiconductor device 200. Further, the tilted reactive ion beam 230 emitted by the tunable optics 722 may be a directed ribbon beam.

The reactive ion beam etching system 700 may be used for irradiating 130 the material 220 to be structured with the tilted reactive ion beam 230 at the non-orthogonal angle to the front side surface 201 such that an undesired portion of the material 220 to be structured is etched due to the irradiating 130 with the tilted reactive ion beam 230 while an irradiation of another portion of the material 220 to be structured is masked by an edge 211 of the trench 210.

For example, by using the reactive ion beam etching system 700 a directed reactive chemical processing may be combined with shadowing effects known from implantation.

Further, the reactive ion beam etching system 700 may allow a generation of a highly conformal ribbon beam.

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIG. 1-6b).

Some embodiments relate to a method for the realization of vertical structured trench oxides by a directed etch process. The method may comprise a directed reactive beam process as a superior alternative to conventional etching processes. By using, e.g., a selective oxide etch a trench side wall oxide may be etched only to a certain depth using the shadowing of silicon mesas to guard the lower regions. This shielding may be improved due to a high conformity of the reactive beam together with its selectivity between, e.g., oxide and silicon. The depth up to which the oxide is removed may in this case may be defined by the angle of the reactive beam and the width of the trenches 210. This may allow for a high reproducibility especially over a wafer diameter.

An aspect relates to a front-end production process for power semiconductor devices with trench-electrodes making use of modern tools with directed, reactive ion beams.

A further aspect relates to a trench oxide with a step-like thickness increase in vertical direction combined with a graded oxide variation between the at least two plateaus of constant oxide thickness. For example, optionally the transition between the step-like thickness increase in a vertical direction may show a graded transition zone, which is differently on the both sides of the trench 211. Furthermore and optionally, the upper trench corners on both sides of the trench 211 may exhibit unsymmetrical shape.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions. The instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising:
a gate trench of a vertical transistor structure, wherein the gate trench extends from a front side surface of a semiconductor substrate into the semiconductor substrate, wherein the gate trench includes a sidewall with a substantially vertical portion, the front side surface separated from the substantially vertical portion of the sidewall by either an edge between the front side surface and the substantially vertical portion of the sidewall or a lateral part of an edge surface between the front side surface and the substantially vertical portion of the sidewall;
wherein at least one of the lateral part of the edge surface of the gate trench comprises at least one of a minimal angle between adjacent surface portions of the at least one lateral part of the edge surface larger than 100° and a minimal radius of curvature of the at least one lateral part of the edge surface larger than 100 nm; and
wherein the at least one of the lateral part of the edge surface extends from the front side surface of the semiconductor substrate to the substantially vertical portion of the side wall of the trench,
wherein the side wall of the gate trench is covered by an insulating layer with vertically varying thickness, wherein the insulating layer comprises a lower portion covering the substantially vertical portion of the sidewall and a bottom of the gate trench, an upper portion covering the substantially vertical portion of the sidewall and having a thickness that is less than a thickness of the lower portion, and a beveled portion between the lower portion and the upper portion covering the substantially vertical portion of the sidewall.

2. The semiconductor device of claim 1, wherein the at least one lateral part of the edge surface comprises a tilted surface portion, wherein an extension of the tilted surface portion is larger than 50 nm and an angle between the tilted surface portion and the front side surface is between 20° and 80°.

3. The semiconductor device of claim 1, wherein a width of the gate trench at 80% of a maximal depth of the gate trench is less than 90% of a width of the gate trench at 10% of a maximal depth of the gate trench.

4. The semiconductor device of claim 1, wherein the semiconductor substrate is a wide band gap semiconductor substrate.

5. The semiconductor device of claim 1, wherein the vertical transistor structure comprises a breakdown voltage of more than 10V.

6. A semiconductor device comprising:
a gate trench of a vertical transistor structure, wherein the gate trench extends from a front side surface of a semiconductor substrate into the semiconductor substrate, wherein the gate trench includes a sidewall with a substantially vertical portion, the front side surface separated from the substantially vertical portion of the sidewall by either an edge between the front side surface and the substantially vertical portion of the sidewall or a lateral part of an edge surface between the front side surface and the substantially vertical portion of the sidewall; and a gate electrode located within the gate trench, wherein the gate electrode comprises a slanted or triangular top, wherein a portion of the gate electrode within the gate trench is higher than an end point of the gate electrode at the substantially vertical portion of the side wall of the gate trench;

wherein at least one of the lateral part of the edge surface of the gate trench comprises at least one of a minimal angle between adjacent surface portions of the at least one of the lateral part of the edge surface larger than 100° and a minimal radius of curvature of the at least one of the lateral part of the edge surface larger than 100 nm; and wherein the at least one of the lateral part of the edge surface extends from the front side surface of the semiconductor substrate to the substantially vertical portion of the side wall of the trench.

7. The semiconductor device of claim 6, wherein the at least one of the lateral part of the edge surface comprises a tilted surface portion, wherein an extension of the tilted surface portion is larger than 50 nm and an angle between the tilted surface portion and the front side surface is between 20° and 80°.

8. The semiconductor device of claim 6, wherein a width of the gate trench at 80% of a maximal depth of the gate trench is less than 90% of a width of the gate trench at 10% of a maximal depth of the gate trench.

9. The semiconductor device of claim 6, wherein the semiconductor substrate is a wide band gap semiconductor substrate.

10. The semiconductor device of claim 6, wherein the vertical transistor structure comprises a breakdown voltage of more than 10V.

11. The semiconductor device of claim 6, wherein the side wall of the gate trench is covered by an insulating layer with vertically varying thickness.

12. The semiconductor device of claim 11, wherein the insulating layer comprises a lower portion, an upper portion having a thickness less than a thickness of the lower portion, and a beveled portion between the lower portion and the upper portion.

13. A semiconductor device comprising:
a gate trench of a vertical transistor structure, wherein the gate trench extends from a front side surface of a semiconductor substrate into the semiconductor substrate, wherein the gate trench includes a sidewall with a substantially vertical portion, the front side surface separated from the substantially vertical portion of the sidewall by either an edge between the front side surface and the substantially vertical portion of the sidewall or a lateral part of an edge surface between the front side surface and the substantially vertical portion of the sidewall; and an insulating layer with vertically varying thickness covering the side wall of the gate trench, wherein the insulating layer comprises a lower portion covering the substantially vertical portion of the sidewall and a bottom of the gate trench, an upper portion covering the substantially vertical portion of the sidewall and having a thickness that is less than a thickness of the lower portion, and a beveled portion between the lower portion and the upper portion covering the substantially vertical portion of the sidewall, and wherein the upper portion of the insulating layer has a bevel at the front side surface of the semiconductor substrate.

14. The semiconductor device of claim 13, further comprising:
wherein at least one of the lateral part of the edge surface of the gate trench comprises at least one of a minimal angle between adjacent surface portions of the at least one of the lateral part of the edge surface larger than 100° and a minimal radius of curvature of the at least one of the lateral part of the edge surface larger than 100 nm.

15. The semiconductor device of claim 13, further comprising:
a gate electrode located within the gate trench, wherein the gate electrode comprises a slanted or triangular top.

16. The semiconductor device of claim 13, further comprising:
a shielding electrode located within the gate trench, wherein the shielding electrode comprises a slanted or triangular top.

17. The semiconductor device of claim 16, further comprising:
a capping layer atop the shielding electrode.

18. The semiconductor device of claim 13, wherein the semiconductor substrate is a wide band gap semiconductor substrate.

19. The semiconductor device of claim 13, wherein the vertical transistor structure comprises a breakdown voltage of more than 10V.

* * * * *